United States Patent
Kang et al.

(10) Patent No.: US 9,287,251 B2
(45) Date of Patent: Mar. 15, 2016

(54) METHOD OF MANUFACTURING A SEMICONDUCTOR DEVICE

(71) Applicant: Samsung Electronics Co., Ltd., Suwon-si, Gyeonggi-do (KR)

(72) Inventors: Pil-Kyu Kang, Anyang-si (KR); Seok-Ho Kim, Bucheon-si (KR); Tae-Yeong Kim, Suwon-si (KR); Hyo-Ju Kim, Seoul (KR); Byung-Lyul Park, Seoul (KR); Yeun-Sang Park, Yongin-si (KR); Jin-Ho An, Seoul (KR); Ho-Jin Lee, Seoul (KR); Joo-Hee Jang, Hwaseong-si (KR); Deok-Young Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/794,561

(22) Filed: Jul. 8, 2015

(65) Prior Publication Data

US 2016/0020197 A1    Jan. 21, 2016

(30) Foreign Application Priority Data

Jul. 18, 2014   (KR) ........................ 10-2014-0090916

(51) Int. Cl.
   *H01L 21/00*   (2006.01)
   *H01L 25/00*   (2006.01)
   *H01L 21/768*  (2006.01)
   *H01L 23/00*   (2006.01)

(52) U.S. Cl.
   CPC .......... *H01L 25/50* (2013.01); *H01L 21/76802* (2013.01); *H01L 21/76831* (2013.01); *H01L 21/76877* (2013.01); *H01L 24/83* (2013.01)

(58) Field of Classification Search
   CPC ................... H01L 21/76831; H01L 21/76877; H01L 24/83; H01L 21/76802
   See application file for complete search history.

(56) References Cited

U.S. PATENT DOCUMENTS

| 6,097,096 A | 8/2000 | Gardner et al. |
| 7,842,540 B2 | 11/2010 | Tong et al. |
| 8,664,106 B2 | 3/2014 | Iwatsu |
| 8,664,763 B2 | 3/2014 | Kagawa et al. |
| 8,896,125 B2 | 11/2014 | Kagawa et al. |
| 2004/0157407 A1 | 8/2004 | Tong et al. |
| 2010/0022035 A1* | 1/2010 | Yamano ......................... 438/15 |
| 2012/0028412 A1* | 2/2012 | Jeong et al. ................... 438/107 |
| 2012/0094469 A1 | 4/2012 | Landru |

(Continued)

FOREIGN PATENT DOCUMENTS

| JP | 2011-049270 | 3/2011 |
| JP | 2011-060941 | 3/2011 |

(Continued)

*Primary Examiner* — Richard Booth
(74) *Attorney, Agent, or Firm* — Myers Bigel Sibley, P.A.

(57) ABSTRACT

In a method, a first opening is formed in a first insulating interlayer on a first substrate. A first conductive pattern structure contacting a first diffusion prevention insulation pattern and having a planarized top surface is formed in the first opening. Likewise, a second conductive pattern structure contacting a second diffusion prevention insulation pattern is formed in a second insulating interlayer on a second substrate. A plasma treatment process is performed on at least one of the first and second substrates having the first and second conductive pattern structures thereon, respectively. The first and second conductive pattern structures are contacted to each other to bond the first and second substrates.

20 Claims, 10 Drawing Sheets

(56) References Cited

U.S. PATENT DOCUMENTS

| | | |
|---|---|---|
| 2013/0009321 A1 | 1/2013 | Kagawa et al. |
| 2013/0175697 A1 | 7/2013 | Nguyen et al. |
| 2013/0285253 A1 | 10/2013 | Aoki et al. |
| 2013/0334638 A1 | 12/2013 | Chen et al. |
| 2014/0131874 A1 | 5/2014 | Kagawa et al. |

FOREIGN PATENT DOCUMENTS

| | | |
|---|---|---|
| JP | 2012-204501 | 10/2012 |
| JP | 2013-038112 | 2/2013 |
| JP | 2013-229415 | 11/2013 |
| KR | 10-1330969 | 11/2013 |
| KR | 1020140010491 A | 1/2014 |

\* cited by examiner

METHOD OF MANUFACTURING A SEMICONDUCTOR DEVICE

CROSS-REFERENCE TO RELATED APPLICATION

This application claims priority under 35 USC §119 to Korean Patent Application No. 10-2014-0090916, filed on Jul. 18, 2014 in the Korean Intellectual Property Office (KIPO), the disclosure of which is incorporated by reference herein in its entirety.

BACKGROUND

Example embodiments of the present inventive concepts relate to methods of manufacturing semiconductor devices. More particularly, example embodiments of the present inventive concepts relate to methods of manufacturing semiconductor devices having a stacked structure.

In order to increase the degree of integration of a semiconductor device, a technique of stacking substrates has been developed. When substrates, each of which has an insulating interlayer containing a conductive pattern therein, are bonded to each other to form a stacked structure, the conductive patterns and the insulating interlayers may be bonded well so that a semiconductor device including the stacked structure may be manufactured with a good electrical reliability.

SUMMARY

Example embodiments of the present inventive concepts provide a method of manufacturing a semiconductor device having a stacked structure and a good electrical reliability.

According to example embodiments of the present inventive concepts, there is provided a method of manufacturing a semiconductor device. In the method, a first opening may be formed in a first insulating interlayer on a first substrate. A first diffusion prevention insulation layer may be formed on an inner wall of the first opening and on the first insulating interlayer. The first diffusion prevention insulation layer may be anisotropically etched to form a first diffusion prevention insulation pattern on the inner wall of the first opening. A first conductive pattern structure may be formed in the first opening provided with the first diffusion prevention insulation pattern therein. The first conductive pattern structure may have a planarized top surface. A second opening may be formed in a second insulating interlayer on a second substrate. A second diffusion prevention insulation layer may be formed on an inner wall of the second opening and on the second insulating interlayer. The second diffusion prevention insulation layer may be etched to form a second diffusion prevention insulation pattern on the inner wall of the second opening. A second conductive pattern structure may be formed in the second opening provided with the second diffusion prevention insulation pattern therein. A plasma treatment process may be performed on at least one of the first and second substrates provided with the first and second conductive pattern structures thereon, respectively. The first and second conductive pattern structures may be contacted to each other to bond the first and second substrates.

In example embodiments of the present inventive concepts, the first and second diffusion prevention insulation layers may include silicon nitride or silicon carbonitride.

In example embodiments of the present inventive concepts, the plasma treatment process may be performed using nitrogen plasma, hydrogen plasma, mixed plasma including nitrogen and hydrogen, tetrafluoromethane ($CF_4$) plasma, and/or ammonia plasma.

In example embodiments of the present inventive concepts, when the first and second substrates are bonded, the first conductive pattern structure may not directly contact the second insulating interlayer.

In example embodiments of the present inventive concepts, when the first and second substrates are bonded, the second conductive pattern structure may not directly contact the first insulating interlayer.

In example embodiments of the present inventive concepts, a third insulating interlayer containing a third conductive pattern structure therein may be further formed between the first substrate and the first insulating interlayer. When the first opening is formed, the first insulating interlayer may be etched to expose a top surface of the third conductive pattern structure.

In example embodiments of the present inventive concepts, a first etch stop layer including silicon nitride or silicon carbonitride may be further formed between the third insulating interlayer and the first insulating interlayer. When the first opening is formed, both of the first insulating interlayer and the first etch stop layer may be etched to expose the top surface of the third conductive pattern structure.

In example embodiments of the present inventive concepts, a fourth insulating interlayer containing a fourth conductive pattern structure therein may be further formed between the second substrate and the second insulating interlayer. When the second opening is formed, the second insulating interlayer may be etched to expose a top surface of the fourth conductive pattern structure.

In example embodiments of the present inventive concepts, a second etch stop layer including silicon nitride or silicon carbonitride may be formed between the fourth insulating interlayer and the second insulating interlayer. When the second opening is formed, both of the second insulating interlayer and the second etch stop layer may be etched to expose the top surface of the fourth conductive pattern structure.

In example embodiments of the present inventive concepts, when the first conductive pattern structure is formed, a first barrier layer may be formed in the first opening provided with the first diffusion prevention insulation pattern therein, and on the first insulating interlayer. A first conductive layer may be formed on the first barrier layer using copper within the first opening. The first conductive layer and the first barrier layer may be planarized until a top surface of the first insulating interlayer is exposed. When the second conductive pattern structure is formed, a second barrier layer may be formed in the second opening provided with the second diffusion prevention insulation pattern therein, and on the second insulating interlayer. A second conductive layer may be formed on the second barrier layer using copper within the second opening. The second conductive layer and the second barrier layer may be planarized until a top surface of the second insulating interlayer is exposed.

According to example embodiments of the present inventive concepts, there is provided a method of manufacturing a semiconductor device. In the method, a first insulating interlayer containing a first conductive pattern structure therein may be formed on a first substrate. A first etch stop layer and a second insulating interlayer may be sequentially formed on the first insulating interlayer to cover the first conductive pattern structure. A first opening may be formed through the second insulating interlayer and the first etch stop layer to expose a top surface of the first conductive pattern structure. A first diffusion prevention insulation layer may be formed on an inner wall of the first opening and on the second insulating interlayer. The first diffusion prevention insulation layer may be anisotropically etched to form a first diffusion prevention insulation pattern on the inner wall of the first opening. A second conductive pattern structure having a planarized top surface may be formed in the first opening having the first diffusion prevention insulation pattern therein. A third insulating interlayer containing a third conductive pattern structure therein may be formed on a second substrate. A second etch stop layer and a fourth insulating interlayer may be sequentially formed on the third insulating interlayer to cover the third conductive pattern structure. A second opening may be formed through the fourth insulating interlayer and the second etch stop layer to expose a top surface of the third conductive pattern structure. A second diffusion prevention insulation layer may be formed on an inner wall of the second opening and on the fourth insulating interlayer. The second diffusion prevention insulation layer may be anisotropically etched to form a second diffusion prevention insulation pattern on the inner wall of the second opening. A fourth conductive pattern structure having a planarized top surface may be formed in the second opening in which the second diffusion prevention insulation pattern is formed. A plasma treatment process may be performed on at least one of the first and second substrates provided with the second and fourth conductive pattern structures thereon, respectively. The second and fourth conductive pattern structures may be contacted to each other to bond the first and second substrates.

In example embodiments of the present inventive concepts, the first and second diffusion prevention insulation patterns may contact each other.

In example embodiments of the present inventive concepts, each of the first to fourth conductive pattern structures may include a barrier layer pattern and a conductive pattern.

In example embodiments of the present inventive concepts, the plasma treatment process may be performed using nitrogen plasma, hydrogen plasma, mixed plasma including nitrogen and hydrogen, tetrafluoromethane ($CF_4$) plasma, and/or ammonia plasma.

In example embodiments of the present inventive concepts, the first and second etch stop layers and the first diffusion prevention insulation patterns may include silicon nitride or silicon carbonitride.

According to example embodiments of the present inventive concepts, there is provided a method of manufacturing a semiconductor device. A first stacked structure may be formed having a planarized surface and comprising a first substrate, a first insulating interlayer on the first substrate, a first conductive pattern structure, and a first diffusion prevention insulation pattern. The first conductive pattern structure may be within the first insulating interlayer and may have a surface coplanar with a surface of the first insulating interlayer. The first diffusion prevention insulation pattern may be within the first insulating interlayer and adjacent to the first conductive pattern structure. The diffusion prevention insulation pattern may have a surface coplanar with the surface of the first insulating interlayer. A second stacked structure may be formed having a planarized surface and comprising a second substrate, a second insulating interlayer on the second substrate, a second conductive pattern structure, and a second diffusion prevention insulation pattern. The second conductive pattern structure may be within the second insulating interlayer and may have a surface coplanar with a surface of the second insulating interlayer and with a surface of the second stacked structure. The second diffusion prevention insulation pattern may be within the second insulating interlayer and adjacent to the second conductive pattern structure. The diffusion prevention insulation pattern may have a surface coplanar with the surface of the second insulating interlayer. A plasma treatment may be performed on at least one of the surfaces of the first and the second stacked structures. The surface of the first stacked structure may be disposed on the surface of the second stacked structure such that the first conductive pattern structure is in contact with the second conductive pattern structure, but the first conductive pattern structure is not in contact with the second insulating interlayer and the second conductive pattern structure is not in contact with the first insulating interlayer. Then, the first stacked structure may be bonded to the second stacked structure.

In example embodiments of the present inventive concepts, disposing the surface of the first stacked structure on the surface of the second stacked structure may further comprise placing the first diffusion prevention insulation pattern in contact with the second conductive pattern structure and placing the second diffusion prevention insulation pattern in contact with the first conductive pattern structure.

In example embodiments of the present inventive concepts, disposing the surface of the first stacked structure on the surface of the second stacked structure may further comprise placing the surface of the first stacked structure in contact with the surface of the second stacked structure such that the interface between the first insulating interlayer and the second insulating interlayer is free of the first diffusion prevention insulation pattern and the second diffusion prevention insulation pattern.

In example embodiments of the present inventive concepts, the first diffusion prevention insulation pattern and the second diffusion prevention insulation pattern may include a nitride.

In example embodiments of the present inventive concepts, the first conductive pattern structure may include a first conductive pattern and a first barrier layer pattern. The first barrier layer pattern may include a metal or a metal nitride.

According to example embodiments of the present inventive concepts, when substrates having insulating interlayers containing conductive pattern structures therein are bonded with each other, elements of the conductive pattern structures may not be diffused into the insulating interlayers due to diffusion prevention insulation patterns. Thus, a semiconductor device including the substrates may have electrical characteristics not deteriorated due to the bonding of the substrates, and may have good reliability.

BRIEF DESCRIPTION OF THE DRAWINGS

Example embodiments will be more clearly understood from the following detailed description taken in conjunction with the accompanying drawings. FIGS. 1 to 11 represent non-limiting, example embodiments of the present inventive concepts as described herein.

DETAILED DESCRIPTION OF THE EMBODIMENTS

Various example embodiments of the present inventive concepts will be described more fully hereinafter with reference to the accompanying drawings, in which some example embodiments of the present inventive concepts are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe a relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
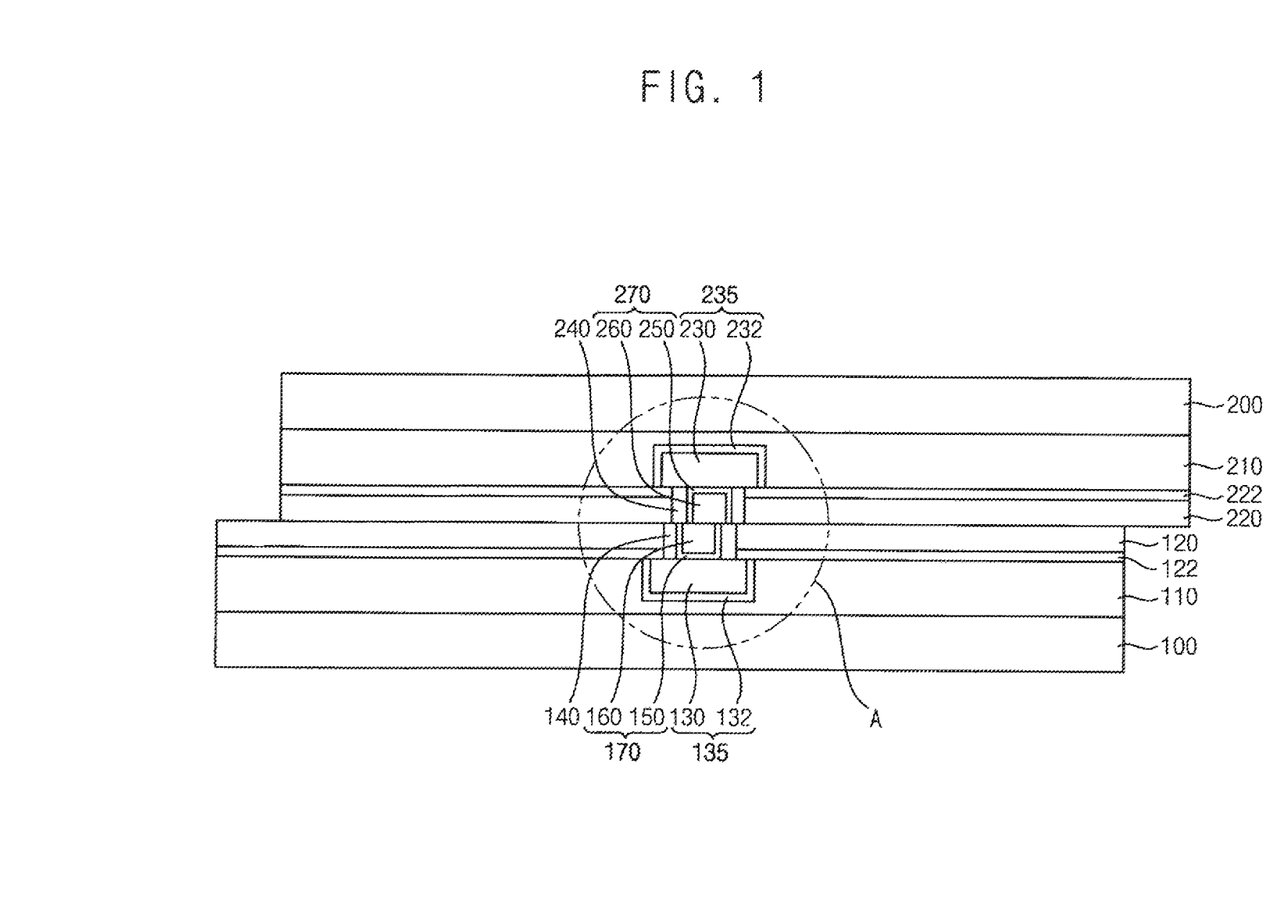
FIG. 1 is a cross-sectional view illustrating a semiconductor device in accordance with example embodiments of the present inventive concepts.
Figure 2:
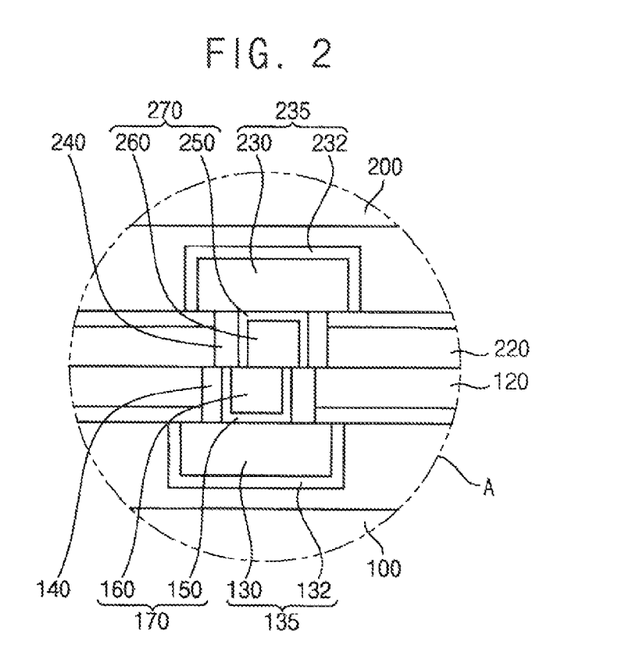
FIG. 2 is an enlarged view of a region A of FIG. 1.
Figure 3:
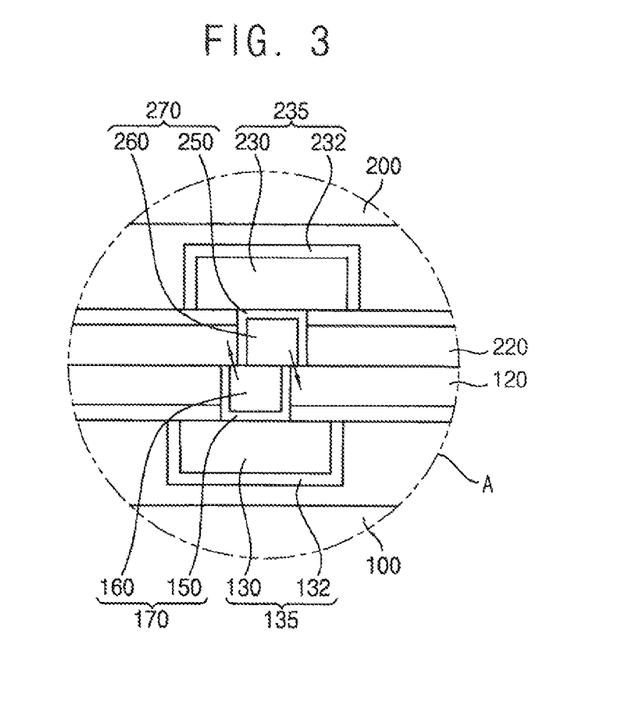
FIG. 3 is an enlarged view of a region of a semiconductor device corresponding to the region A of FIG. 1 in contrast with example embodiments of the present inventive concepts.

FIG. 1 is a cross-sectional view illustrating a semiconductor device in accordance with example embodiments of the present inventive concepts, and FIG. 2 is an enlarged view of a region A of FIG. 1. FIG. 3 is an enlarged view of a region of a semiconductor device corresponding to the region A of FIG. 1 in contrast with example embodiments of the present inventive concepts.

Referring to FIGS. 1 and 2, the semiconductor device may include a first insulating interlayer 120 and a second insulating interlayer 220 sequentially stacked, a first conductive pattern structure 170 contained by the first insulating interlayer 120, a first diffusion prevention insulation pattern 140 contacting a sidewall of the first conductive pattern structure 170, a second conductive pattern structure 270 contained by the second insulating interlayer 220 and contacting a top surface of the first conductive pattern structure 170, and a second diffusion prevention insulation pattern 240 contacting a sidewall of the second conductive pattern structure 270. An outer sidewall of the first diffusion prevention insulation pattern 140 may contact the first insulating interlayer 120, and an outer sidewall of the second diffusion prevention insulation pattern 240 may contact the second insulating interlayer 220.

The semiconductor device of the present inventive concepts may further include a third insulating interlayer 110 between a first substrate 100 and the first insulating interlayer 120, a third conductive pattern structure 135 contacting a bottom surface of the first conductive pattern structure 170, a fourth insulating interlayer 210 on the second insulating interlayer 220, and a fourth conductive pattern structure 235 contacting a top surface of the second conductive pattern structure 270. At least a portion of the third conductive pattern structure 135 may be contained by the third insulating interlayer 110, and at least a portion of the fourth conductive pattern structure 235 may be contained by the fourth insulating interlayer 210.

The semiconductor device may further include a first etch stop layer 122 between the third insulating interlayer 110 and the first insulating interlayer 120, which may contact a lower portion of the outer sidewall of the first diffusion prevention insulation pattern 140, and a second etch stop layer 222 between the second insulating interlayer 220 and the fourth insulating interlayer 210, which may contact an upper portion of the outer sidewall of the second diffusion prevention insulation pattern 240. For example, the first and second etch stop layers 122 and 222 may include a nitride, e.g., silicon nitride, silicon carbonitride, etc. In some embodiments of the present inventive concepts, the semiconductor device may not include the first and second etch stop layers 122 and 222.

The semiconductor device may further include a second substrate 200 on the fourth insulating interlayer 210. The first and second substrates 100 and 200 may include a semiconductor material, e.g., silicon, germanium, silicon-germanium, etc. Alternatively, the first and second substrates 100 and 200 may include a compound semiconductor, e.g., silicon carbide, gallium arsenide, gallium phosphide, indium phosphide, indium arsenide, indium antimonide, etc.

The first to fourth insulating interlayers 120, 220, 110 and 210 may include an oxide, e.g., silicon oxide. In example embodiments of the present inventive concepts, the first to fourth insulating interlayers 120, 220, 110 and 210 may include substantially the same material.

In example embodiments of the present inventive concepts, the first conductive pattern structure 170 may include a first conductive pattern 160 and a first barrier layer pattern 150 contacting a bottom surface and a sidewall of the first conductive pattern 160 and contacting a top surface of the third conductive pattern structure 135 and an inner sidewall of the first diffusion prevention insulation pattern 140. Additionally, the second conductive pattern structure 270 may include a second conductive pattern 260 and a second barrier layer pattern 250 contacting a top surface and a sidewall of the second conductive pattern 260 and contacting a top surface of the first conductive pattern structure 170 and an inner sidewall of the second diffusion prevention insulation pattern 240.

In example embodiments of the present inventive concepts, the third conductive pattern structure 135 may include a third conductive pattern 130 and a third barrier layer pattern 132 contacting a sidewall and a bottom surface of the third conductive pattern 130. The fourth conductive pattern structure 235 may include a fourth conductive pattern 230 and a fourth barrier layer pattern 232 contacting a sidewall and a top surface of the fourth conductive pattern 230. The third conductive pattern structure 135 may be electrically connected to the first substrate 100 by a via contact, and the fourth conductive pattern structure 235 may be electrically connected to the second substrate 200 by a via contact.

The first to fourth conductive patterns 160, 260, 130 and 230 may include, e.g., copper. Alternatively, the first to fourth conductive patterns 160, 260, 130 and 230 may include, for example, tungsten or aluminum.

The first to fourth barrier layer patterns 150, 250, 132 and 232 may include a metal, e.g., tantalum, titanium, ruthenium, cobalt, nickel, etc., and/or a metal nitride, e.g., tantalum nitride, titanium nitride, tungsten nitride, etc.

The first to fourth conductive patterns 160, 260, 130 and 230 and the first to fourth barrier layer patterns 150, 250, 132 and 232 may have a single layer structure or a multi-layered structure.

The first and second diffusion prevention insulation patterns 140 and 240 may include a nitride, e.g., silicon nitride, silicon carbonitride, etc.

As illustrated in detail in FIG. 2, the first and second conductive pattern structures 170 and 270 may not be aligned with each other. However, in example embodiments of the present inventive concepts, a top surface of the first conductive pattern structure 170 may contact the second conductive pattern structure 270 and the second diffusion prevention insulation pattern 240, and thus may not directly contact the second insulating interlayer 220. As a result, when the first substrate 100 having the first conductive pattern structure 170 and the first insulating interlayer 120 is bonded with the second substrate 200 having the second conductive pattern structure 270 and the second insulating interlayer 220 at a high temperature, a metal element included in the first conductive pattern structure 170 may not be diffused into the second insulating interlayer 220.

Likewise, in example embodiments, a bottom surface of the second conductive pattern structure 270 may contact the first conductive pattern structure 170 and the first diffusion prevention insulation pattern 140, and thus may not directly contact the first insulating interlayer 120. As a result, when the first substrate 100 having the first conductive pattern structure 170 and the first insulating interlayer 120 is bonded with the second substrate 200 having the second conductive pattern structure 270 and the second insulating interlayer 220 at a high temperature, a metal element included in the second conductive pattern structure 270 may not be diffused into the first insulating interlayer 120.

Thus, the semiconductor device in accordance with example embodiments of the present inventive concepts may have electrical characteristics that may not be deteriorated when the first and second substrates 100 and 200 are bonded with each other.

The first and second conductive pattern structures 170 and 270 are shown to be misaligned with each other in FIGS. 1 and 2, however, the present inventive concepts may not be limited thereto. The first and second substrates 100 and 200 may be bonded with each other so that the first and second conductive pattern structures 170 and 270 may be well aligned with each other, and in this case, the first and second conductive pattern structures 170 and 270 may directly contact each other, and the first and second diffusion prevention insulation patterns 140 and 240 may directly contact each other. In this case, the metal elements of the first and second conductive pattern structures 170 and 270 may not be diffused into the second and first insulating interlayers 220 and 120, respectively, even without the diffusion prevention insulation patterns 140 and 240.

Regardless of the alignment of the first and second conductive pattern structures 170 and 270, the first and second diffusion prevention insulation patterns 140 and 240 may directly contact each other, and even though the first and second conductive pattern structures 170 and 270 are misaligned with each other, the first and second diffusion prevention insulation patterns 140 and 240 may have sufficiently large thicknesses so as to contact the second and first conductive pattern structures 270 and 170 to prevent direct contact with the first and second insulating interlayers 120 and 220, respectively.

In some embodiments of the present inventive concepts, the second substrate 200 may be removed, and thus the semiconductor device may not include the second substrate 200.

However, as illustrated in FIG. 3, semiconductor device in contrast to embodiments of the present inventive concepts may have no diffusion prevention insulation pattern such as the first and second diffusion prevention insulation patterns 140 and 240 shown in FIGS. 1 and 2, and thus when the first and second substrates 100 and 200 are bonded with each other, a metal element of the first conductive pattern 160 may be diffused into the second insulating interlayer 220, or a metal element of the second conductive pattern 260 may be diffused into the first insulating interlayer 120. Thus, the semiconductor device of the comparative example may have electrical characteristics that may be deteriorated during the bonding of the first and second substrates 100 and 200.

FIGS. 4 to 11 are cross-sectional views illustrating stages of a method of manufacturing a semiconductor device of the present inventive concepts.

Figure 4:
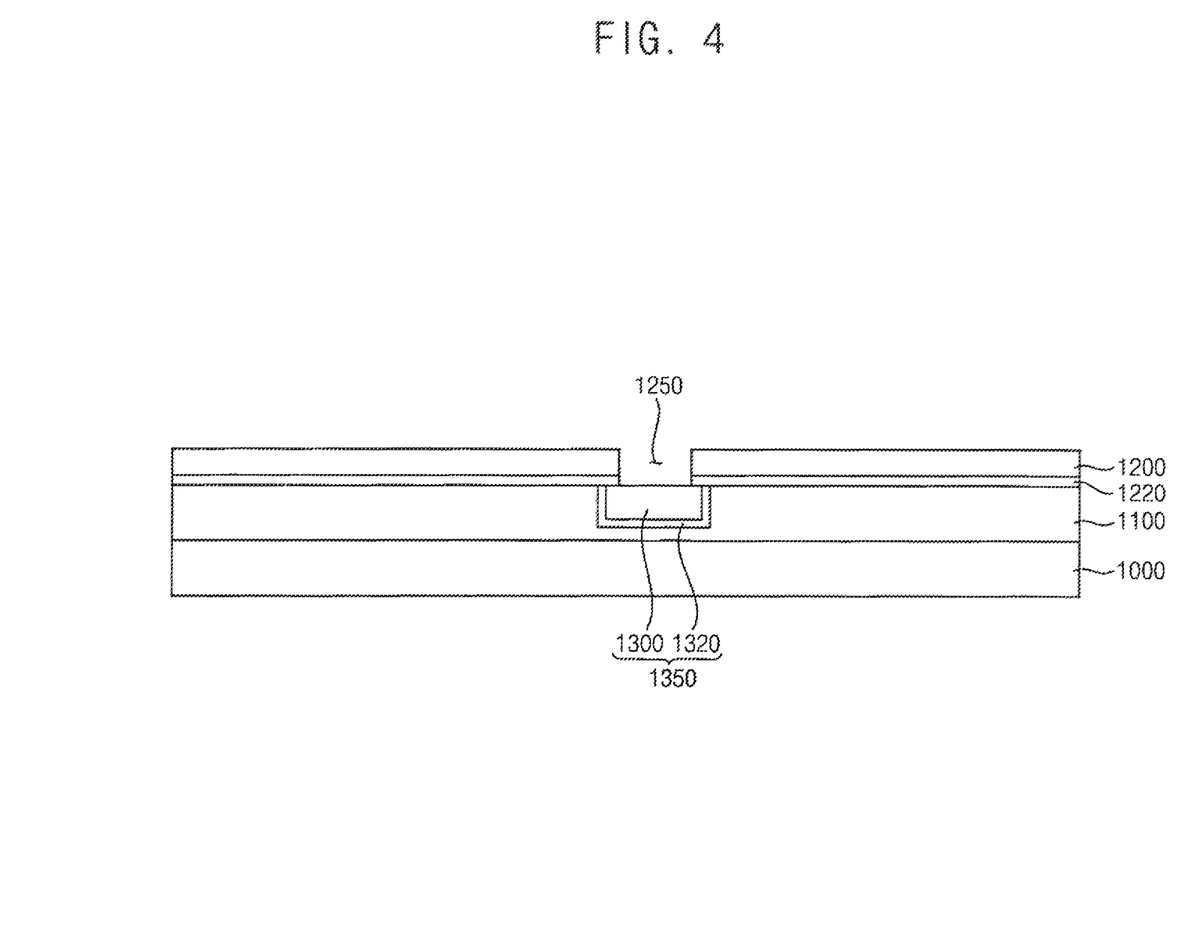
FIGS. 4 to 11 are cross-sectional views illustrating stages of a method of manufacturing a semiconductor device in accordance with the present inventive concepts.

Referring to FIG. 4, a first lower insulating interlayer 1100 containing a first lower conductive pattern structure 1350 therein may be formed on a first substrate 1000, a first etch stop layer 1220 and a first upper insulating interlayer 1200 may be sequentially formed on the first lower insulating interlayer 1100, and a first opening 1250 may be formed through the first upper insulating interlayer 1200 and the first etch stop layer 1220 to expose a top surface of the first lower conductive pattern structure 1350.

The first substrate 1000 may include a semiconductor material, e.g., silicon, germanium, silicon-germanium, etc. Alternatively, the first substrate 1000 may include a compound semiconductor, e.g., silicon carbide, gallium arsenide, gallium phosphide, indium phosphide, indium arsenide, indium antimonide, etc.

The first lower insulating interlayer 1100 may be formed of or include an oxide, e.g., silicon oxide.

In example embodiments of the present inventive concepts, a recess may be formed on the first lower insulating interlayer 1100, a first lower barrier layer may be formed on an inner wall of the recess and on the first lower insulating interlayer 1100, a first lower conductive layer may be formed on the first lower barrier layer to sufficiently fill the recess, and the first conductive layer and the first lower barrier layer may be planarized until a top surface of the first lower insulating interlayer 1100 may be exposed. Thus, a first lower conductive pattern structure 1350 including a first lower barrier layer pattern 1320 on the inner wall of the recess and a first lower conductive pattern 1300 in a remaining portion of the recess may be formed. A bottom surface and a sidewall of the first lower conductive pattern 1300 may contact the first lower barrier layer pattern 1320.

The first lower barrier layer pattern 1320 may be formed of or include a metal, e.g., tantalum, titanium, ruthenium, cobalt, nickel, etc., and/or a metal nitride, e.g., tantalum nitride, titanium nitride, tungsten nitride, etc. The first lower conductive pattern 1300 may be formed of or include, e.g., copper. Alternatively, the first lower conductive pattern 1300 may be formed of or include, for example, aluminum or tungsten.

The first lower conductive pattern 1300 and the first lower barrier layer pattern 1320 may be formed of or have a single layer structure or a multi-layered structure.

The first etch stop layer 1220 may be formed of or include a nitride, e.g., silicon nitride, silicon carbonitride, etc. In some embodiments, the first etch stop layer 1220 may not be formed.

The first upper insulating interlayer 1200 may be formed of or include an oxide, e.g., silicon oxide. In example embodiments of the present inventive concepts, the first upper insulating interlayer 1200 may be formed of or include a material substantially the same as that of the first lower insulating interlayer 1100.

The first opening 1250 may be formed by etching the first upper insulating interlayer 1200 and the first etch stop layer 1220 to expose at least a top surface of the first lower conductive pattern 1300 of the first lower conductive pattern structure 1350.

Figure 5:
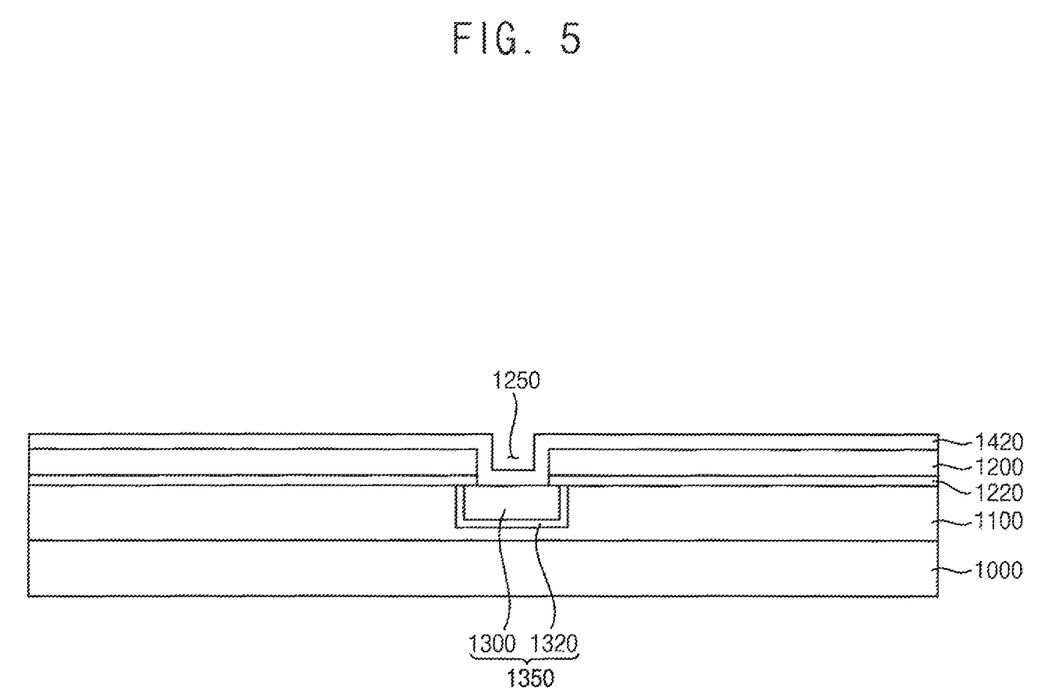

Referring to FIG. 5, a first diffusion prevention insulation layer 1420 may be formed on the exposed top surface of the first lower conductive pattern structure 1350, an inner wall of the first opening 1250, and a top surface of the first upper insulating interlayer 1200.

The first diffusion prevention insulation layer 1420 may be formed of or include a nitride, e.g., silicon nitride, silicon carbonitride, etc., and may be formed by a chemical vapor deposition (CVD) process, an atomic layer deposition (ALD) process, or a spin coating process.

The first diffusion prevention insulation layer 1420 may be formed to have a sufficiently large thickness so as to contact a second upper conductive pattern structure 2700 (refer to FIG. 9) subsequently formed and bonded to the first upper conductive pattern structure 1700. Thus, the second upper conductive pattern structure 2700 may not directly contact the first upper insulating interlayer 1200.

Figure 6:
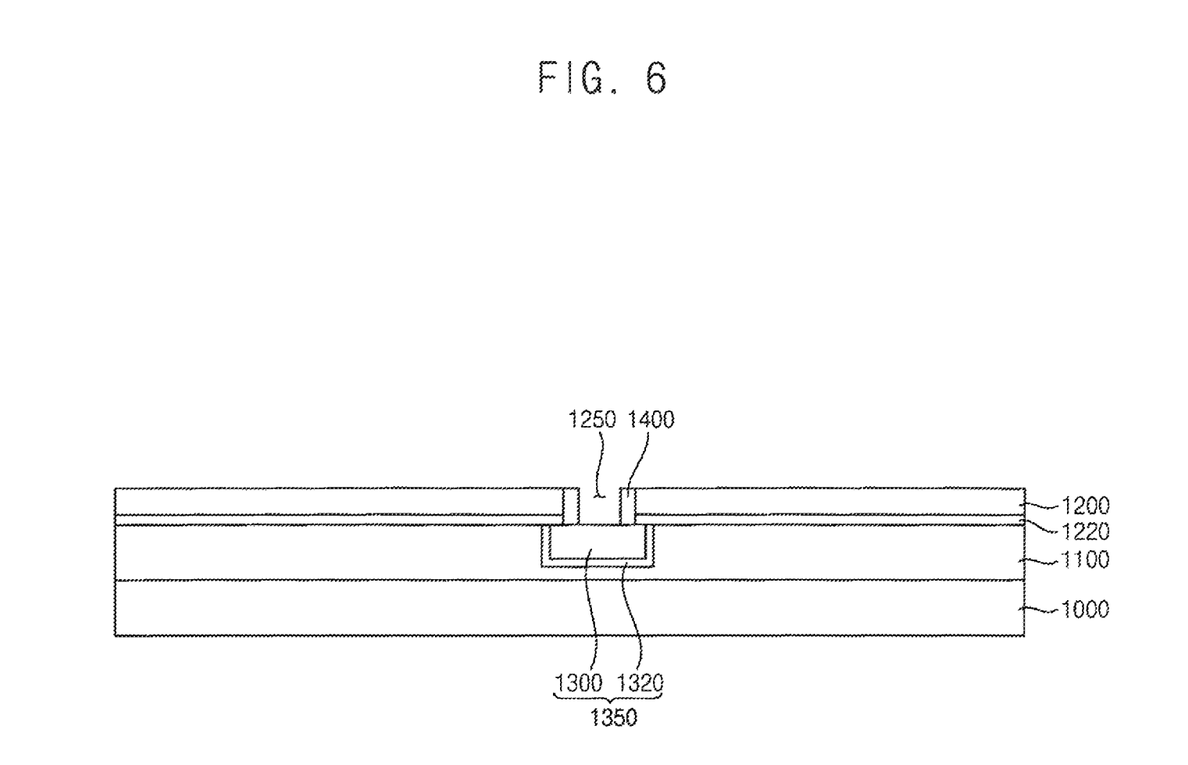

Referring to FIG. 6, the first diffusion prevention insulation layer 1420 may be partially removed to form a first diffusion prevention insulation pattern 1400 on the inner wall of the first opening 1250.

In example embodiments of the present inventive concepts, the first diffusion prevention layer 1420 may be anisotropically etched to form the first diffusion prevention insulation pattern 1400 only on the inner wall of the first opening 1250, and thus the top surface of the first lower conductive pattern structure 1350 may be exposed. The first diffusion prevention insulation pattern 1400 may contact the first etch stop layer 1220.

Figure 7:
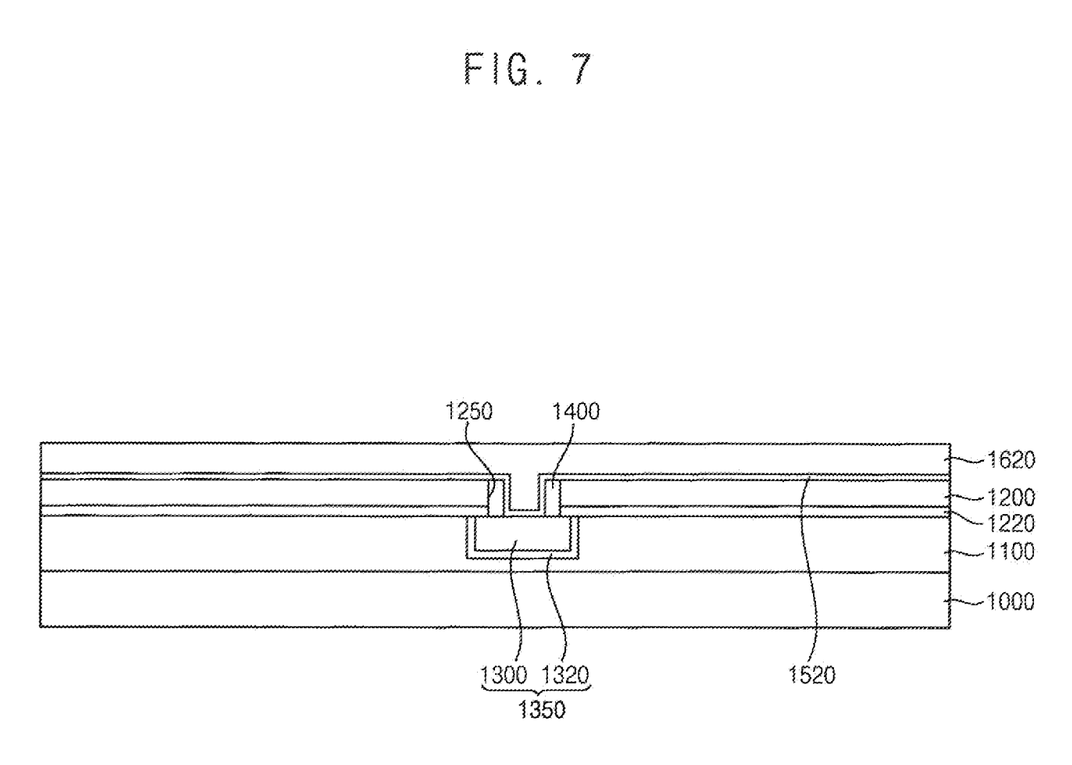

Referring to FIG. 7, a first upper barrier layer 1520 may be formed on the exposed top surface of the first lower conductive pattern structure 1350, the first diffusion prevention insulation pattern 1400 and the first upper insulating interlayer 1200, and a first upper conductive layer 1620 may be formed on the first upper barrier layer 1520 to fill a remaining portion of the first opening 1250.

The first upper barrier layer 1520 may be formed of or include a metal or a metal nitride. In example embodiments of the present inventive concepts, the first upper barrier layer 1520 may be formed of or include a material substantially the same as that of the first lower barrier layer 1320.

The first upper conductive layer 1620 may be formed of or include, e.g., copper. For example, the first upper conductive layer 1620 may be a copper layer formed by an electroplating process. In some embodiments of the present inventive concepts, the first upper conductive layer 1620 may be formed of or include, for example, aluminum or tungsten.

Figure 8:
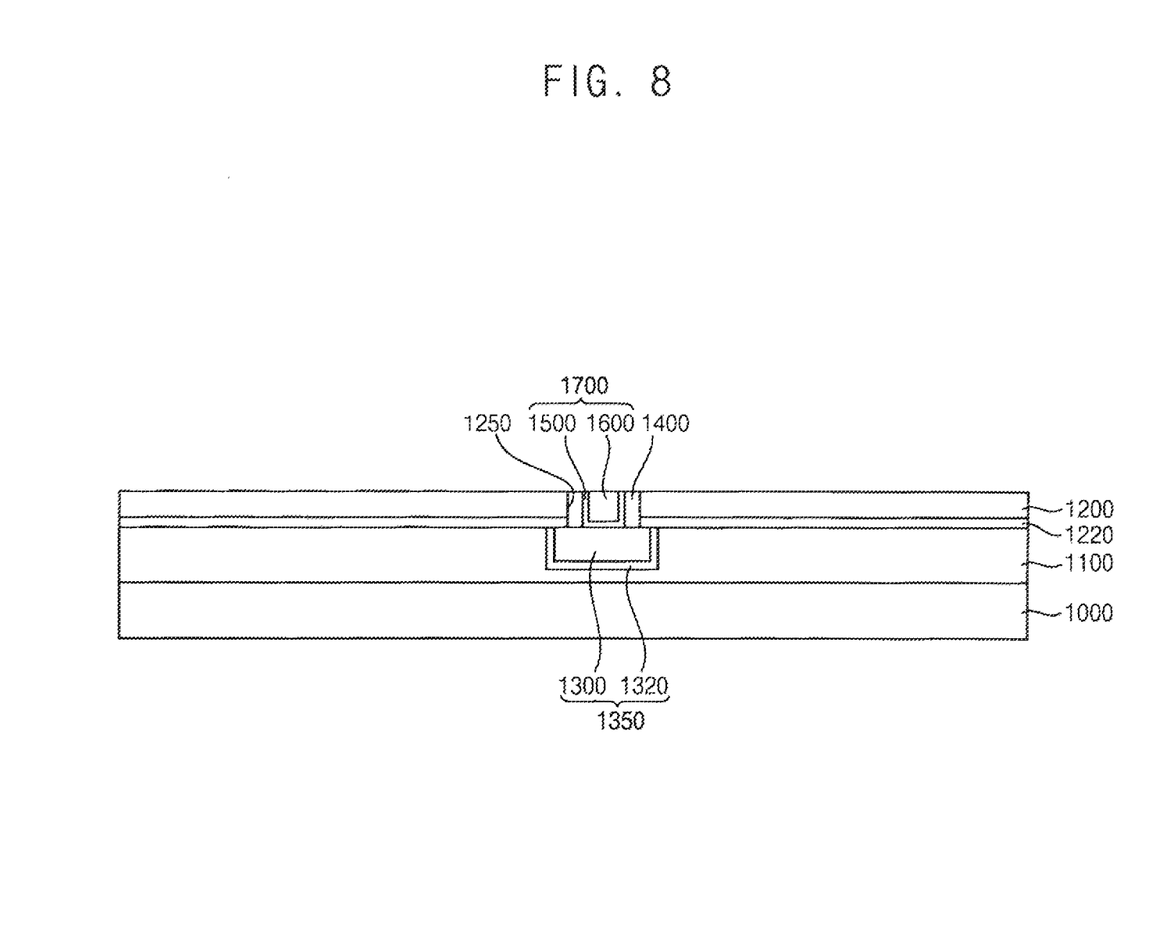

Referring to FIG. 8, the first upper conductive layer 1620 and the first upper barrier layer 1520 may be planarized until a top surface of the first upper insulating interlayer 1200 may be exposed to form a first upper conductive pattern structure 1700 in the first opening 1250, which may include a first upper barrier layer pattern 1500 and a first upper conductive pattern 1600.

For example, the planarization process may be performed by a chemical mechanical polishing (CMP) process and/or an etch back process.

By the above processes, the first lower and upper insulating interlayers 1100 and 1200 may be sequentially formed on the first substrate 1000, and the first lower and upper conductive pattern structures 1350 and 1700 may be contained by the first lower and upper insulating interlayers 1100 and 1200, respectively.

Figure 9:
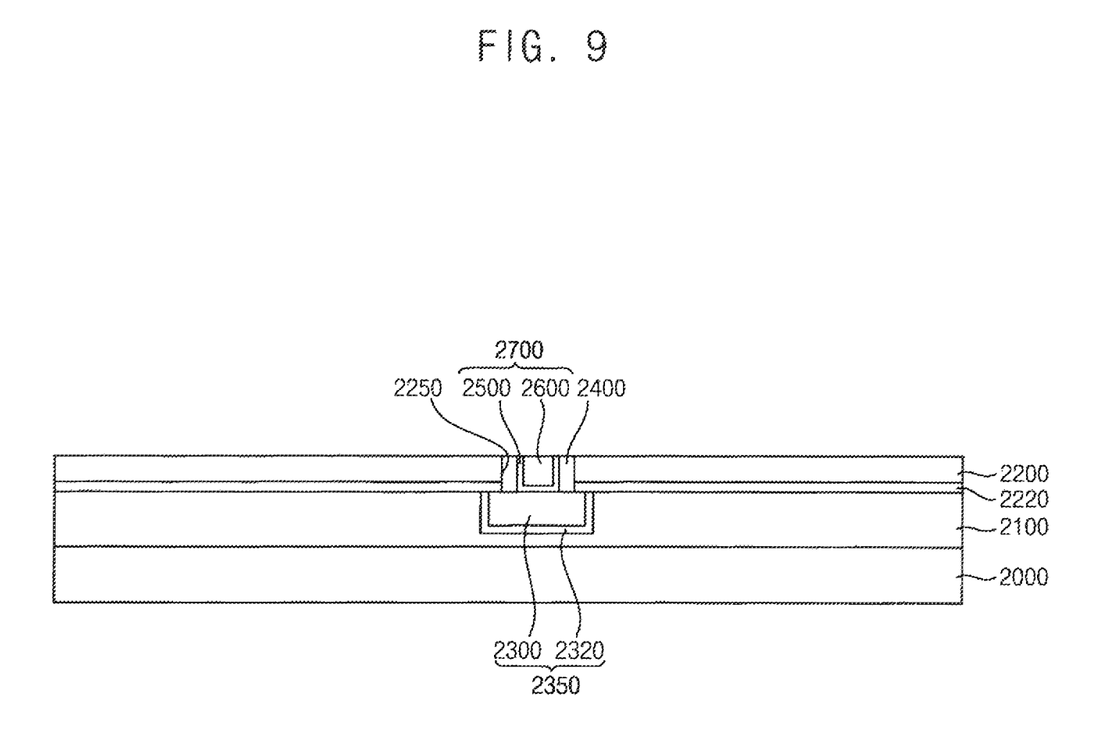

Referring to FIG. 9, processes substantially the same as or similar to those illustrated with reference to FIGS. 4 to 8 may be performed to form second lower and upper insulating interlayers 2100 and 2200 sequentially stacked on a second substrate 2000, and second lower and upper conductive pattern structures 2350 and 2700 contained by the second lower and upper insulating interlayers 2100 and 2200, respectively.

The second substrate 2000 may include a material substantially the same as that of the first substrate 1000. Each of the second lower and upper insulating interlayers 2100 and 2200 may be formed of or include an oxide, e.g., silicon oxide. In example embodiments of the present inventive concepts, the second upper and lower insulating interlayers 2100 and 2200 may be formed of or include materials substantially the same as those of the first upper and lower insulating interlayers 1100 and 1200.

A second etch stop layer 2220 may be further formed between the second lower insulating interlayer 2100 and the second upper insulating interlayer 2200 and be formed of or include a nitride, e.g., silicon nitride, silicon carbonitride, etc.

The second lower conductive pattern structure 2350 may be formed to include a second lower conductive pattern 2300 and a second lower barrier layer pattern 2320 surrounding a bottom surface and a sidewall of the second lower conductive pattern 2300. The second upper conductive pattern structure 2700 may be formed to include a second upper conductive pattern 2600 and a second upper barrier layer pattern 2500 contacting a bottom surface and a sidewall of the second upper conductive pattern 2600.

Each of the second lower and upper conductive patterns 2300 and 2600 may be formed of or include, e.g., copper. Alternatively, the second lower and upper conductive patterns 2300 and 2600 may be formed of or include, for example, aluminum or tungsten.

The second lower and upper barrier layer patterns 2320 and 2500 may be formed of or include a metal, e.g., tantalum, titanium, ruthenium, cobalt, nickel, etc., and/or a metal nitride, e.g., tantalum nitride, titanium nitride, tungsten nitride, etc.

A second diffusion prevention insulation pattern 2400 may be formed on a sidewall of the second upper conductive pattern structure 2700 and be formed of or include a nitride, e.g., silicon nitride, silicon carbonitride, etc.

The formation of the second diffusion prevention insulation pattern 2400 may include forming a second opening 2250 through the second upper insulating interlayer 2200 and the second etch stop layer 2220 to expose a top surface of the second lower conductive pattern 2300, forming a second diffusion prevention insulation layer on an inner wall of the second opening 2250 and on the second upper insulating interlayer 2200, and anisotropically etching the second diffusion prevention insulation layer to expose a top surface of the second upper insulating interlayer 2200. The second diffusion prevention insulation pattern 2400 may be formed to directly contact the second etch stop layer 2220.

The second upper conductive pattern structure 2700 may be formed in the second opening 2250. Particularly, a second upper barrier layer and a second upper conductive layer may be formed in the second opening 2250, the second upper conductive layer and the second upper barrier layer may be planarized until a top surface of the second upper insulating interlayer 2200 may be exposed to form a second upper conductive pattern 2600 and a second upper barrier layer pattern 2500, respectively.

Figure 10:
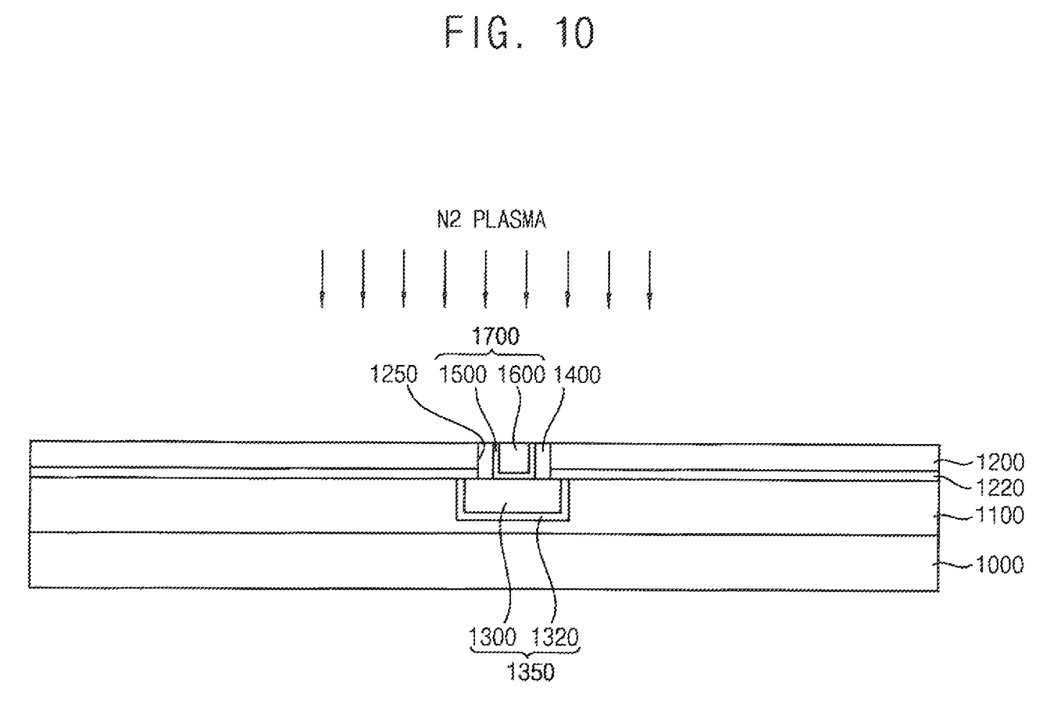

Referring to FIG. 10, a plasma treatment process may be performed on at least one of the first and second substrates 1000 and 2000 provided with the first and second upper conductive pattern structures 1700 and 2700 thereon, respectively. That is, the plasma treatment process may be performed on the surfaces of the first upper insulating interlayer 1200, the first upper conductive pattern structure 1700 and a first diffusion insulation pattern 1400, and/or the surfaces of second upper insulating interlayer 2200, the second upper conductive pattern structure 2700 and the second diffusion insulation pattern 2400.

The plasma treatment process may be performed using, e.g., nitrogen plasma. In some embodiments of the present inventive concepts, the plasma treatment process may be performed, for example, using hydrogen plasma, a mixed plasma including nitrogen and hydrogen, tetrafluoromethane ($CF_4$) plasma, and/or ammonia plasma. The plasma treatment process may be performed using a capacitively coupled plasma source or an inductively coupled plasma source.

By the plasma treatment process, the first upper conductive pattern structure 1700 on the first substrate 1000 and/or the second upper conductive pattern structure 2700 on the second substrate 2000 may be activated.

Figure 11:
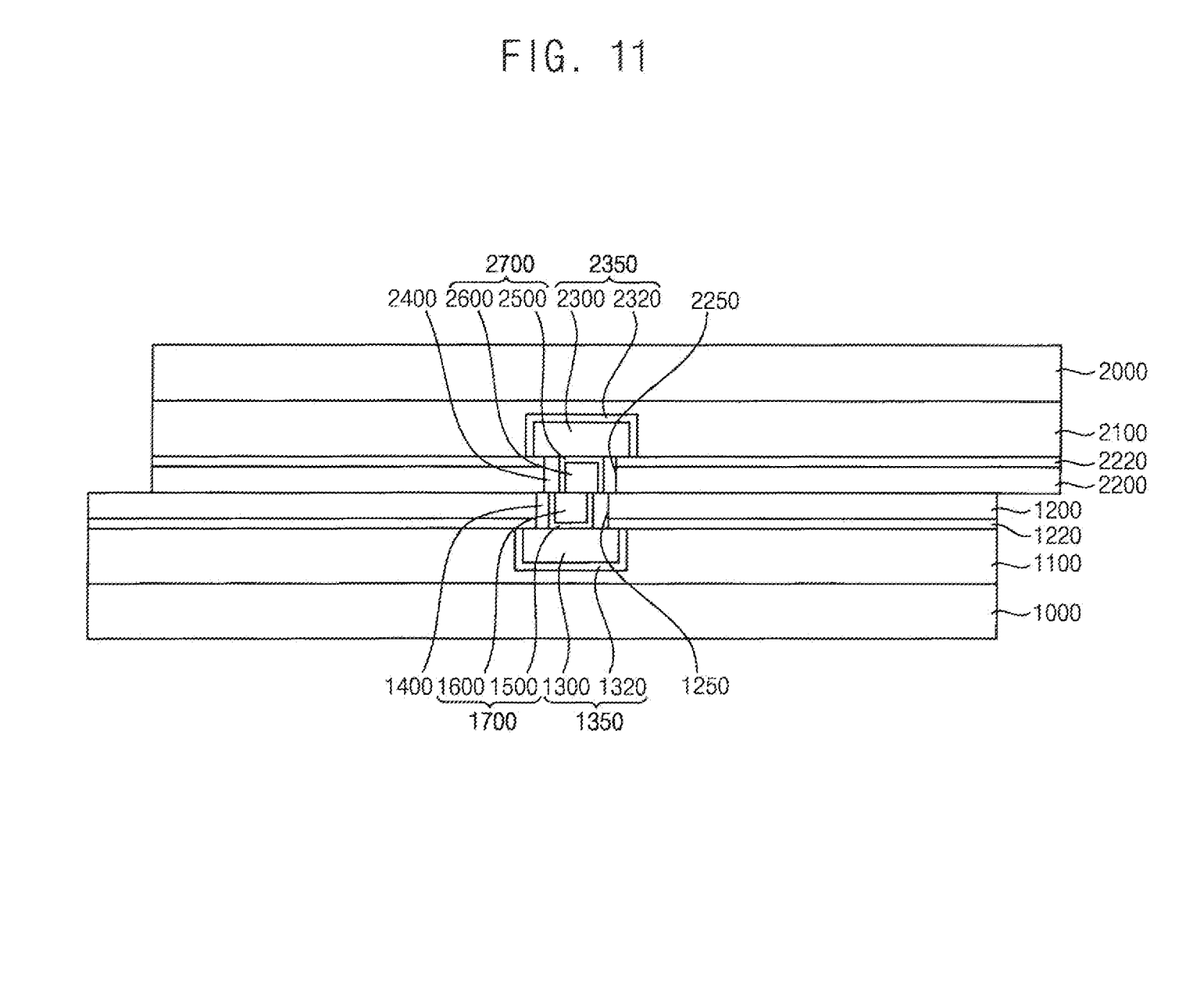

Referring to FIG. 11, the first and second upper conductive pattern structures 1700 and 2700 may be placed in contact with each other so that the first and second substrates 1000 and 2000 may be bonded with each other. The first and second upper conductive pattern structures 1700 and 2700 may be electrically connected to each other. In example embodiments of the present inventive concepts, after turning the second substrate 2000 upside down, the first and second substrates 1000 and 2000 may be bonded with each other at a high temperature. Hereinafter, the top surface of the second substrate 2000 in FIG. 9 may be referred to as a bottom surface in FIG. 11, and the bottom surface of the second substrate 2000 in FIG. 9 may be referred to as a top surface in FIG. 11. The first and second substrates 1000 and 2000 may be bonded with each other so that the first and second upper insulating interlayers 1200 and 2200 may be aligned with each other. However, in some embodiments of the present inventive concepts, when the first and second substrates 1000 and 2000 are bonded with each other, the first and second upper conductive pattern structures 1700 and 2700 may be misaligned as illustrated in FIG. 11.

Even though the first and second upper conductive pattern structures 1700 and 2700 are misaligned with each other, the first and second upper conductive pattern structures 1700 and 2700 may contact the second and first diffusion prevention insulation patterns 2400 and 1400, respectively, and thus may not directly contact the second and first upper insulating interlayers 2200 and 1200, respectively.

That is, when the first and second substrates 1000 and 2000 are bonded with each other so that the first and second upper conductive pattern structures 1700 and 2700 may be aligned, the first and second upper conductive pattern structures 1700 and 2700 may directly contact each other, and the first and second diffusion prevention insulation patterns 1400 and 2400 may also directly contact each other. However, when the first and second upper conductive pattern structures 1700 and 2700 are misaligned, the second and first diffusion prevention insulation patterns 2400 and 1400 may directly contact the first and second upper conductive pattern structures 1700 and 2700, respectively, and the second and first diffusion prevention insulation patterns 2400 and 2400 may directly contact each other.

Thus, when the first and second substrates 1000 and 2000 are bonded with each other, elements, e.g., metal elements of the first and second upper conductive pattern structures 1700 and 2700 may not be diffused into the second and first insulating interlayers 2200 and 1200, and the electrical characteristics thereof may not be deteriorated. Accordingly, the semiconductor device of the present inventive concepts including the first and second upper conductive pattern structures 1700 and 2700 may have good electrical characteristics and good reliability.

At least a portion of the second substrate 2000 may be removed, if necessary.

The foregoing is illustrative of example embodiments of the present inventive concepts and is not to be construed as limiting thereof. Although a few example embodiments of the present inventive concepts have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims.

What is claimed is:

1. A method of manufacturing a semiconductor device, the method comprising:
- forming a first opening in a first insulating interlayer on a first substrate;
- forming a first diffusion prevention insulation layer on an inner wall of the first opening and on the first insulating interlayer;
- anisotropically etching the first diffusion prevention insulation layer to form a first diffusion prevention insulation pattern on the inner wall of the first opening;
- forming a first conductive pattern structure in the first opening provided with the first diffusion prevention insulation pattern therein, the first conductive pattern structure having a planarized top surface;
- forming a second opening in a second insulating interlayer on a second substrate;
- forming a second diffusion prevention insulation layer on an inner wall of the second opening and on the second insulating interlayer;
- anisotropically etching the second diffusion prevention insulation layer to form a second diffusion prevention insulation pattern on the inner wall of the second opening;
- forming a second conductive pattern structure in the second opening provided with the second diffusion prevention insulation pattern therein;
- performing a plasma treatment process on at least one of the first and second substrates provided with the first and second conductive pattern structures thereon, respectively; and
- contacting the first and second conductive pattern structures to each other to bond the first and second substrates.

2. The method of claim 1, wherein the first and second diffusion prevention insulation layers include silicon nitride or silicon carbonitride.

3. The method of claim 1, wherein the plasma treatment process is performed using nitrogen plasma, hydrogen plasma, mixed plasma including nitrogen and hydrogen, tetrafluoromethane ($CF_4$) plasma, and/or ammonia plasma.

4. The method of claim 1, wherein bonding the first and second substrates includes bonding the first and second substrates so that the first conductive pattern structure does not directly contact the second insulating interlayer.

5. The method of claim 1, wherein bonding the first and second substrates includes contacting the first and second conductive pattern structures so that the second conductive pattern structure does not directly contact the first insulating interlayer.

6. The method of claim 1, further comprising forming a third insulating interlayer between the first substrate and the first insulating interlayer, the third insulating interlayer containing a third conductive pattern structure therein,
- and wherein forming the first opening includes etching the first insulating interlayer to expose a top surface of the third conductive pattern structure.

7. The method of claim 6, further comprising forming a first etch stop layer between the third insulating interlayer and the first insulating interlayer, the first etch stop layer including silicon nitride or silicon carbonitride,
- and wherein forming the first opening includes etching both of the first insulating interlayer and the first etch stop layer to expose the top surface of the third conductive pattern structure.

8. The method of claim 1, further comprising forming a fourth insulating interlayer between the second substrate and the second insulating interlayer, the fourth insulating interlayer containing a fourth conductive pattern structure therein,
- and wherein forming the second opening includes etching the second insulating interlayer to expose a top surface of the fourth conductive pattern structure.

9. The method of claim 8, further comprising forming a second etch stop layer between the fourth insulating interlayer and the second insulating interlayer, the second etch stop layer including silicon nitride or silicon carbonitride,
- and wherein forming the second opening includes etching both of the second insulating interlayer and the second etch stop layer to expose the top surface of the fourth conductive pattern structure.

10. The method of claim 1, wherein forming the first conductive pattern structure includes:
- forming a first barrier layer in the first opening provided with the first diffusion prevention insulation pattern, and on the first insulating interlayer;
- forming a first conductive layer on the first barrier layer using copper within the first opening; and
- planarizing the first conductive layer and the first barrier layer until a top surface of the first insulating interlayer is exposed,
- and wherein forming the second conductive pattern structure includes:
- forming a second barrier layer in the second opening provided with the second diffusion prevention insulation pattern therein, and on the second insulating interlayer;
- forming a second conductive layer on the second barrier layer using copper within the second opening; and
- planarizing the second conductive layer and the second barrier layer until a top surface of the second insulating interlayer is exposed.

11. A method of manufacturing a semiconductor device, the method comprising:
- forming a first insulating interlayer on a first substrate, the first insulating interlayer containing a first conductive pattern structure therein;
- sequentially forming a first etch stop layer and a second insulating interlayer on the first insulating interlayer to cover the first conductive pattern structure;
- forming a first opening through the second insulating interlayer and the first etch stop layer to expose a top surface of the first conductive pattern structure;
- forming a first diffusion prevention insulation layer on an inner wall of the first opening and on the second insulating interlayer;
- anisotropically etching the first diffusion prevention insulation layer to form a first diffusion prevention insulation pattern on the inner wall of the first opening;
- forming a second conductive pattern structure in the first opening having the first diffusion prevention insulation pattern therein, the second conductive pattern structure having a planarized top surface;
- forming a third insulating interlayer on a second substrate, the third insulating interlayer containing a third conductive pattern structure therein;
- sequentially forming a second etch stop layer and a fourth insulating interlayer on the third insulating interlayer to cover the third conductive pattern structure;
- forming a second opening through the fourth insulating interlayer and the second etch stop layer to expose a top surface of the third conductive pattern structure;
- forming a second diffusion prevention insulation layer on an inner wall of the second opening and on the fourth insulating interlayer;

anisotropically etching the second diffusion prevention insulation layer to form a second diffusion prevention insulation pattern on the inner wall of the second opening;

forming a fourth conductive pattern structure in the second opening in which the second diffusion prevention insulation pattern is formed, the fourth conductive pattern structure having a planarized top surface;

performing a plasma treatment process on at least one of the first and second substrates provided with the second and fourth conductive pattern structures thereon, respectively; and contacting the second and fourth conductive pattern structures to each other to bond the first and second substrates.

12. The method of claim 11, wherein the first and second diffusion prevention insulation patterns contact each other.

13. The method of claim 11, wherein each of the first to fourth conductive pattern structures includes a barrier layer pattern and a conductive pattern.

14. The method of claim 11, wherein the plasma treatment process is performed using nitrogen plasma, hydrogen plasma, mixed plasma including nitrogen and hydrogen, tetrafluoromethane ($CF_4$) plasma, and/or ammonia plasma.

15. The method of claim 11, wherein the first and second etch stop layers and the first diffusion prevention insulation patterns include silicon nitride or silicon carbonitride.

16. A method of manufacturing a semiconductor device, the method comprising:

forming a first stacked structure having a planarized surface and comprising a first substrate, a first insulating interlayer on the first substrate, a first conductive pattern structure within the first insulating interlayer and having a surface coplanar with a surface of the first insulating interlayer, and a first diffusion prevention insulation pattern within the first insulating interlayer and adjacent to the first conductive pattern structure, the first diffusion prevention insulation pattern having a surface coplanar with the surface of the first insulating interlayer;

forming a second stacked structure having a planarized surface and comprising a second substrate, a second insulating interlayer on the second substrate, a second conductive pattern structure within the second insulating interlayer and having a surface coplanar with a surface of the second insulating interlayer, and a second diffusion prevention insulation pattern within the second insulating interlayer and adjacent to the second conductive pattern structure, the second diffusion prevention insulation pattern having a surface coplanar with the surface of the second insulating interlayer;

performing a plasma treatment on at least one of the surfaces of the first and the second stacked structures;

disposing the surface of the first stacked structure on the surface of the second stacked structure such that the first conductive pattern structure is in contact with the second conductive pattern structure, but the first conductive pattern structure is not in contact with the second insulating interlayer and the second conductive pattern structure is not in contact with the first insulating interlayer; and bonding the first stacked structure to the second stacked structure.

17. The method of claim 16, wherein disposing the surface of the first stacked structure on the surface of the second stacked structure further comprises placing the first diffusion prevention insulation pattern in contact with the second conductive pattern structure and placing the second diffusion prevention insulation pattern in contact with the first conductive pattern structure.

18. The method of claim 16, wherein disposing the surface of the first stacked structure on the surface of the second stacked structure further comprises placing the surface of the first stacked structure in contact with the surface of the second stacked structure such that the interface between the first insulating interlayer and the second insulating interlayer is free of the first diffusion prevention insulation pattern and the second diffusion prevention insulation pattern.

19. The method of claim 16, wherein the first diffusion prevention insulation pattern and the second diffusion prevention insulation pattern comprise a nitride.

20. The method of claim 17, wherein the first conductive pattern structure comprises a first conductive pattern and a first barrier layer pattern, and wherein the first barrier layer pattern comprises a metal or a metal nitride.

* * * * *